United States Patent
Yang et al.

(10) Patent No.: US 10,419,006 B1
(45) Date of Patent: Sep. 17, 2019

(54) ENHANCED HARMONIC LOCK FREE DLL FOR SKEW CANCELLATION

(71) Applicant: Brocere Electronics company limited, New Taipei (TW)

(72) Inventors: Yu-Hong Yang, Taichung (TW); Jou-Hung Wang, Taipei (TW); Chih-Hao Lai, Taipei (TW)

(73) Assignee: Brocere Electronics company limited, New Taipei (TW)

(*) Notice: Subject to any disclaimer, the term of this patent is extended or adjusted under 35 U.S.C. 154(b) by 0 days.

(21) Appl. No.: 16/133,717

(22) Filed: Sep. 18, 2018

(51) Int. Cl.
| H03L 7/06 | (2006.01) |
| H03L 7/081 | (2006.01) |
| H03L 7/085 | (2006.01) |

(52) U.S. Cl.
CPC ............ H03L 7/0818 (2013.01); H03L 7/085 (2013.01)

(58) Field of Classification Search
CPC .............................. H03L 7/0818; H03L 7/085
USPC .......................................................... 327/158
See application file for complete search history.

(56) References Cited

U.S. PATENT DOCUMENTS

| 7,391,245 B2 * | 6/2008 | Heyne ................... H03K 5/133 327/149 |
| 7,564,283 B1 * | 7/2009 | Logue ...................... G06F 1/10 327/158 |

* cited by examiner

*Primary Examiner* — Kenneth B Wells
(74) *Attorney, Agent, or Firm* — Winston Hsu

(57) ABSTRACT

A enhanced DLL includes a delay chain, a phase detector and a delay control unit. The delay chain is arranged to delay a reference clock signal to generate a delayed reference clock signal and reflect the delay control setting on the delayed reference clock signal, wherein the delay chain is periodically reset according to a period of the reference clock signal. The phase detector is coupled to the delay chain, and arranged to detect a phase shift between the delayed reference clock signal and the reference clock signal, thereby to generate a control value. The delay control unit is coupled to the delay chain and the phase detector, and arranged to adjust the delay control setting based on the control value.

7 Claims, 8 Drawing Sheets

ENHANCED HARMONIC LOCK FREE DLL FOR SKEW CANCELLATION

BACKGROUND OF THE INVENTION

1. Field of the Invention

The present invention relates generally to delay chain circuitry, and more particularly to a periodically-reset DLL for use in an all-digital skew canceller and the related all-digital skew canceller.

2. Description of the Prior Art

In the conventional art, phase-locked loop (PLL) and delay-lock loop (DLL) are usually employed for use in application regarding cancelling skew between received data signals and a reference clock signal, thereby to establish synchronization between the received data signals and the reference clock signal. However, as the PLL typically includes and relies up a loop filter, a PLL-based design is not excellent in circuit area efficiency. On the hand, as the DLL usually suffer from harmonic lock issue or false lock issue, a DLL-based design is not favorable in wide operating range application. In view of this, there is a need for providing a new architecture in skew cancellation application.

SUMMARY OF THE INVENTION

As mentioned above, it is one objective of the present invention to provide an enhanced DLL for finding a delay control setting for use in a skew canceller. The enhanced DLL of the present invention relies on a periodical reset control signal to periodically reset its delayed output. By resetting the delayed output, the enhanced DLL can avoid the harmonic lock condition. Furthermore, it is another objective of the present invention to provide an all-digital skew canceller which does not comprise any analog circuits such that the circuit area efficiency can be improved.

According to one embodiment of the present invention, an enhanced DLL for finding a delay control setting is provided. The enhanced DLL comprises: a delay chain, a phase detector and a delay control unit. The delay chain is arranged to delay a reference clock signal to generate a delayed reference clock signal and reflect the delay control setting on the delayed reference clock signal. The phase detector is coupled to the delay chain and arranged to detect a phase shift between the delayed reference clock signal and the reference clock signal thereby to generate a control value. The delay control unit is coupled to the delay chain and the phase detector, and arranged to adjust the delay control setting based on the control value. Furthermore, the delay chain comprises a plurality of delay cells that are coupled in series. At least one of the delay cells is arranged to receive a delayed signal outputted from a previous one of the delay cells and a predetermined signal. The at least one of the delay cells is operable in two modes of operation. In a first mode of operation, at least one of the delay cells causes a phase shift on the delayed signal thereby to reflect the delay control setting on the delayed reference clock signal. In a second mode of operation, at least one of the delay cells causes the phase shift on the predetermined signal to reset the delayed reference clock signal. In addition, the first and second modes of the operation are switched according to a period of the reference clock signal.

According to one embodiment of the present invention, an all-digital skew canceller is provided. The all-digital skew canceller comprises: an enhanced DLL, a data delay chain, a multi-edge detector, a calibration unit and a selector. The enhanced DLL has a delay chain that is operable in two modes of operation. The enhanced DLL is arranged to find a delay control setting based on a reference clock signal, wherein the enhanced DLL is periodically reset. The data delay chain is coupled to the enhanced DLL, and arranged to delay a data signal according to the delay control setting, thereby to generate a plurality of delayed data signals having different phase shifts. The multi-edge detector is coupled to the data delay chain, and arranged to respectively detect the phase shifts of the plurality of delayed data signals in relation to an edge of the reference clock signal thereby to generate a plurality of phase information. The calibration unit is coupled to the multi-edge detector, and arranged to generate a selection signal according to the plurality of phase information. The selector is coupled to the data delay circuit, and arranged to select one from the delayed data signals as a skew-cancelled data signal according to the selection signal.

These and other objectives of the present invention will no doubt become obvious to those of ordinary skill in the art after reading the following detailed description of the preferred embodiment that is illustrated in the various figures and drawings.

DETAILED DESCRIPTION

Reference throughout this specification to "one embodiment", or "an example" means that a particular feature, structure or characteristic described in connection with the embodiment or example is included in at least one embodiment of the present embodiments. Thus, appearances of the phrases "in one embodiment", "in or "an example" in various places throughout this specification are not necessarily all referring to the same embodiment or example. Furthermore, the particular features, structures or characteristics may be combined in any suitable combinations and/or sub-combinations in one or more embodiments or examples.

In addition, it is appreciated that the figures provided herewith are for explanation purposes to persons ordinarily skilled in the art and that the drawings are not necessarily drawn to scale.

As used herein, the terms "comprises," "comprising," "includes," "including," "has," "having," or any other variation thereof, are intended to cover a non-exclusive inclusion. For example, a process, article, or apparatus that comprises a list of elements is not necessarily limited to only those elements but may include other elements not expressly listed or inherent to such process, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Additionally, any examples or illustrations given herein are not to be regarded in any way as restrictions on, limits to, or express definitions of any term or terms with which they are utilized. Instead, these examples or illustrations are to be regarded as being described with respect to one particular embodiment and as being illustrative only. Those of ordinary skill in the art will appreciate that any term or terms with which these examples or illustrations are utilized will encompass other embodiments which may or may not be given therewith or elsewhere in the specification and all such embodiments are intended to be included within the scope of that term or terms. Language designating such nonlimiting examples and illustrations includes, but is not limited to: "for example," "for instance," "e.g.," and "in one embodiment."

Figure 1A:
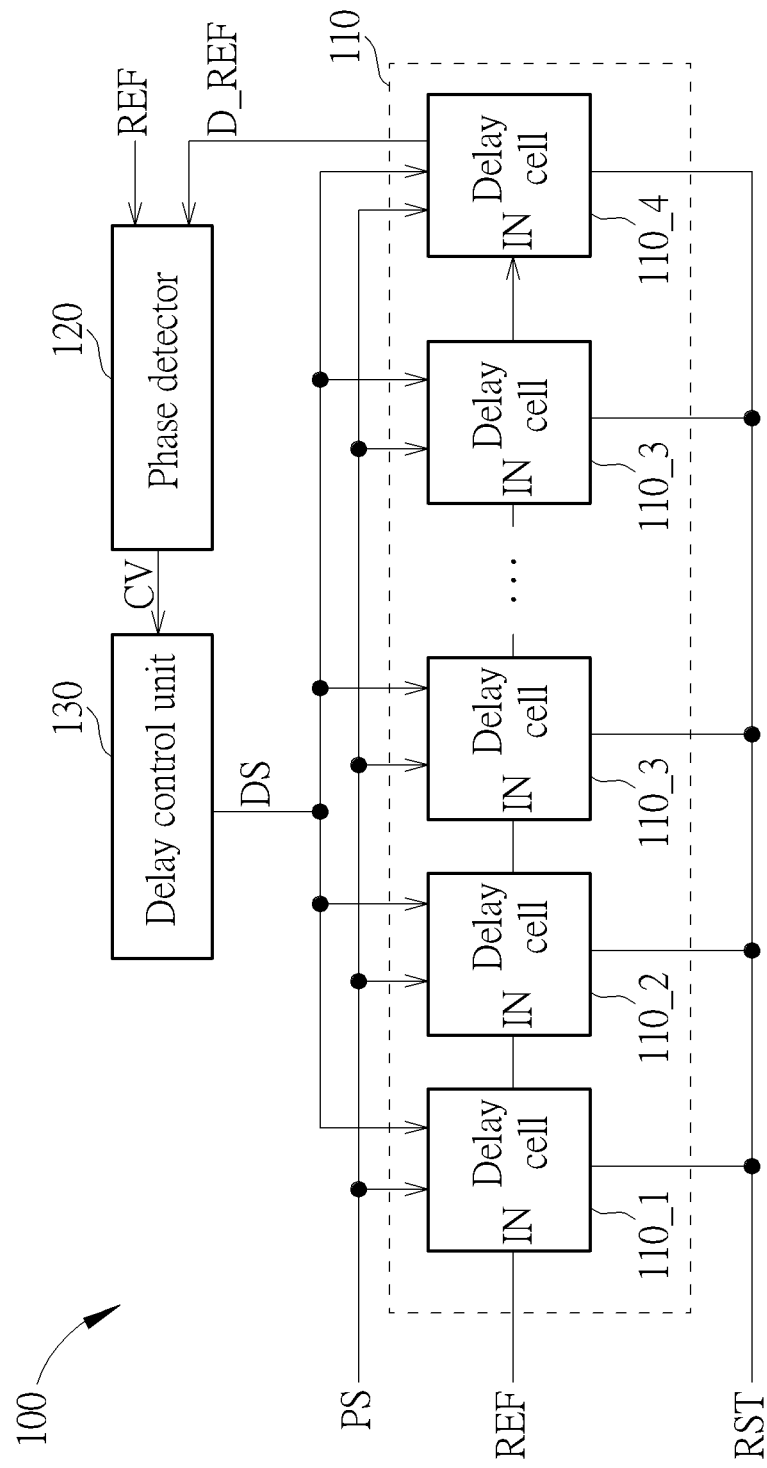
FIG. 1A illustrates a schematic diagram of an enhanced DLL according to one embodiment of the present invention.

FIG. 1A illustrates a schematic diagram of an enhanced DLL 100 according to one embodiment of the present invention. The enhanced DLL 100 is configured to find a delay control setting for controlling a delay chain to preferably delay a reference clock signal by one unit interval (UI).

The enhanced DLL 100 comprises a delay chain 110, a phase detector 120 and a delay control unit 130. The delay chain 110 is arranged to delay a reference clock signal REF to generate a delayed reference clock signal D_REF and reflect the delay control setting DS on the delayed reference clock signal D_REF. The delay chain 110 comprises a plurality of delay cells 110_1-110_N that are coupled in series. One or more of the delay cells 110_1-110_N is arranged to receive a delayed signal outputted from a previous one of the delay cells 110_1-110_N and a predetermined signal PS. The delay cells 110_1-110_N are operable in two modes of operation under the control of a reset control signal RST.

In a first mode of operation, the reset control signal RST may be de-asserted and one or more of the delay cells 110_1-110_N is controlled by the delay control setting DS and could cause a phase shift (; the amount of the phase shift is determined according to the delay control setting DS) on the delayed signal that is received at its input terminal IN. As such, the one or more of the delay cells 110_1-110_N could reflect the delay control setting DS on the delayed reference clock signal D_REF, which is outputted from a last one of the delay cells 110_1-110_N. In a second mode of operation, the reset control signal RST may be asserted and one or more of the delay cells 110_1-110_N could cause the phase shift on the predetermined signal PS. As the predetermined signal PS has a fixed voltage level, this causes the delayed reference clock signal D_REF to be reset.

Figure 1B:
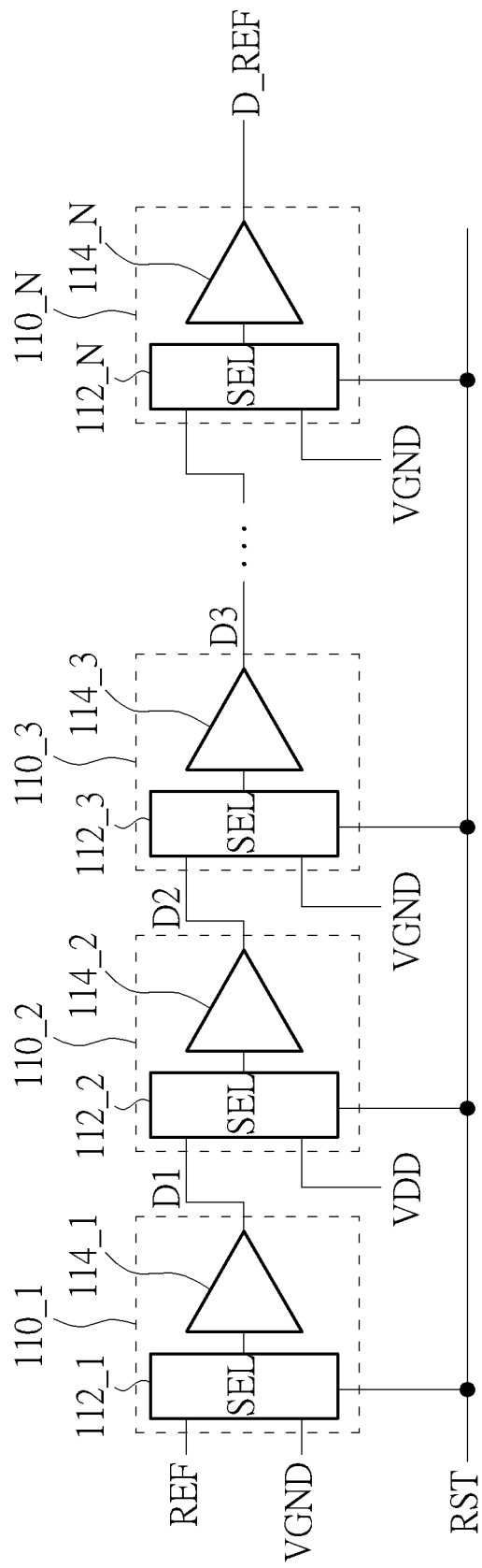
FIG. 1B illustrates a detailed schematic diagram of the delay chain of FIG. 1A according to one embodiment of the present invention.

FIG. 1B illustrates a detailed schematic diagram of the delay chain 110 according to one embodiment of the present invention. As illustrated, each of the delay cells 110_1-110_N may comprise a selector 112_i and a delay gate 114_i. The selector 112_i is controlled by the reset control signal RST. The selector 112_i has a first input for receiving the delayed signal Di from the previous one of the delay cells in series and a second input for receiving the predetermined signal VDD or VGND. The delay gate 114_i is controlled by the delay control setting DS to exhibit an individual phase shift identified by the delay control setting DS and arranged to apply the individual phase shift on the signal selected by the selector 112_i. When the delay cells 110_1-110_N are switched to the first mode of operation, the selector 112_i selects the delayed signal Di received from the previous one of the delay cells 110_1-110_N. On the other hand, when the delay cells 110_1-110_N are switched to the second mode of operation, the selector 112_i selects the predetermined signal VDD or VGND. In a preferred embodiment of the present invention, the delay gate 114_i could be an inverter, and therefore the predetermined signal would be VDD or VGND. However, according to various embodiments of the present invention, the delay gate 114_i may not invert the received delayed signal Di in phase when applying the phase shift on. In this case, the predetermined signal would be all VDD or all VGND.

Figure 2:
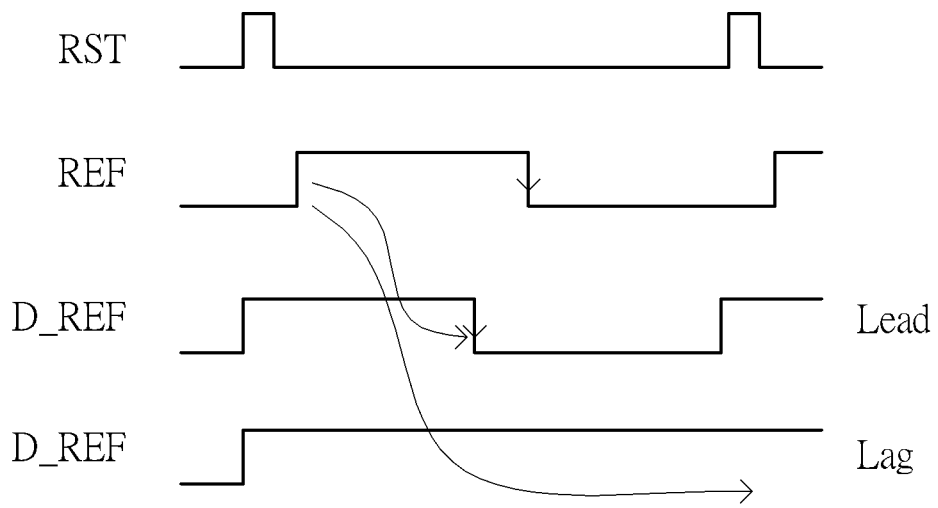
FIG. 2 illustrates relationship between of the reference clock signal and the delayed reference clock signal.

The delay control unit 130 is coupled to the phase detector 120 and is arranged to adjust the delay control setting DS based on a control value CV that is provided by the phase detector 120. Typically, the delay cells 110_1-110_N needs to cause the phase of the delayed reference clock signal D_REF lags behind the phase of the reference clock signal REF by one unit interval (i.e. half a period T of the reference clock signal REF). Therefore, the delay control setting DS generated by the delay control unit 130 needs to cause the delay cells 110_1-110_N to have a total phase shift amount of 0.5T applied on the reference clock signal REF. Please refer to FIG. 2 for better understandings. As shown by FIG. 2, a rising edge of the reference clock signal REF leads to a falling edge of the delayed reference clock signal D_REF (assuming that the delay chain 110 is equivalently an inverter). To achieve the phase shift of 0.5T, the falling edge of the delayed reference clock signal D_REF should be aligned with a falling edge of the reference clock signal REF.

If the falling edge of the delayed reference clock signal D_REF has a phase lead in relative to the falling edge of the reference clock signal REF, this means the total phase shift amount caused by the delay cells 110_1-110_N is lower than the desired phase shift amount of 0.5T. Accordingly, the delay control unit 130 will adjust the delay control setting DS to cause one or more of the delay cells 110_1-110_N to increase the individual phase shift. On other hand, if the falling edge of the delayed reference clock signal D_REF has a phase lag in relative to the falling edge of the reference clock signal REF, this means the total phase shift amount by the delay cells 110_1-110_N is higher than the desired phase shift amount of 0.5T. Accordingly, the delay control unit 130 will adjust the delay control setting DS to cause one or more of the delay cells 110_1-110_N to decrease the individual phase shift.

The phase detector 120 that is coupled to the delay chain 110 is arranged to detect phase shift between the delayed reference clock signal D_REF and the reference clock signal REF. As such, the phase detector 120 generates a control value CV based on the detection result. The delay control unit 130 accordingly adjusts the delay control setting DS based on the control value CV.

Figure 3:
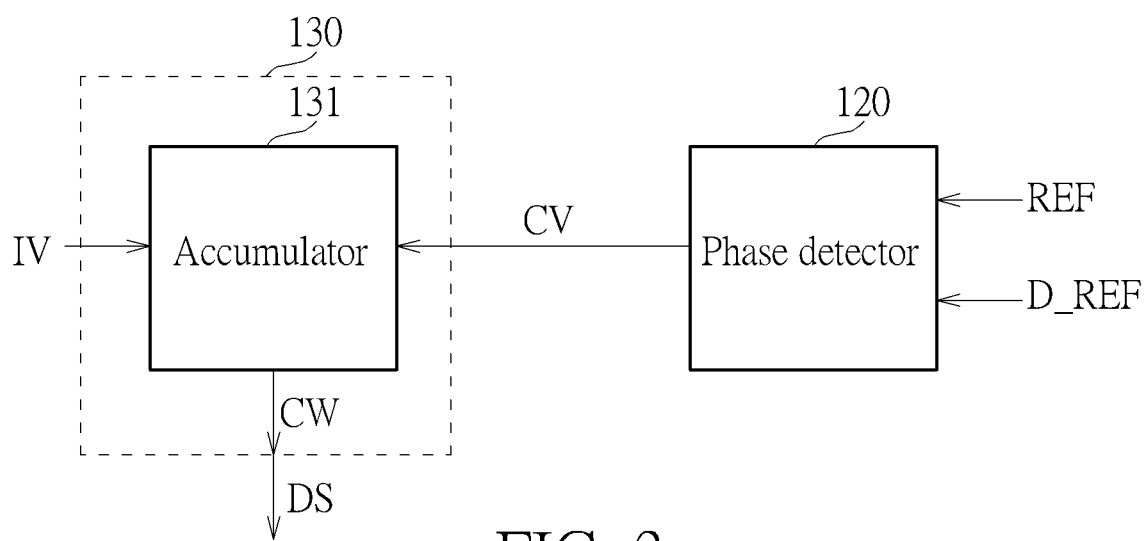
FIG. 3 illustrates a detailed schematic diagram of the delay control unit according to one embodiment of the present invention.

Please refer to FIG. 3 for understanding how the delay control unit 130 adjusts the delay control setting DS according to the control value CV. According to the illustrated embodiment, the delay control unit 130 comprises (but not limited to) an accumulator 131. The accumulator 131 is coupled to the phase detector 120 and arranged to accumulate the control values CV that are generated over a period of time to generate an accumulated value CW. When the phase detector 120 detects the delayed reference clock signal D_REF has a phase lag in relative to the reference clock signal REF, the control value CV causes an increase in the accumulated value CW. On the other hand, when the phase detector 120 detects the delayed reference clock signal D_REF has a phase lead in relative to the reference clock signal REF, the control value CV causes a decrease in the accumulated value CW. Accordingly, the delay control unit 130 adjusts the delay control setting DS according to the accumulated value CW and an initial value IV.

Figure 4:
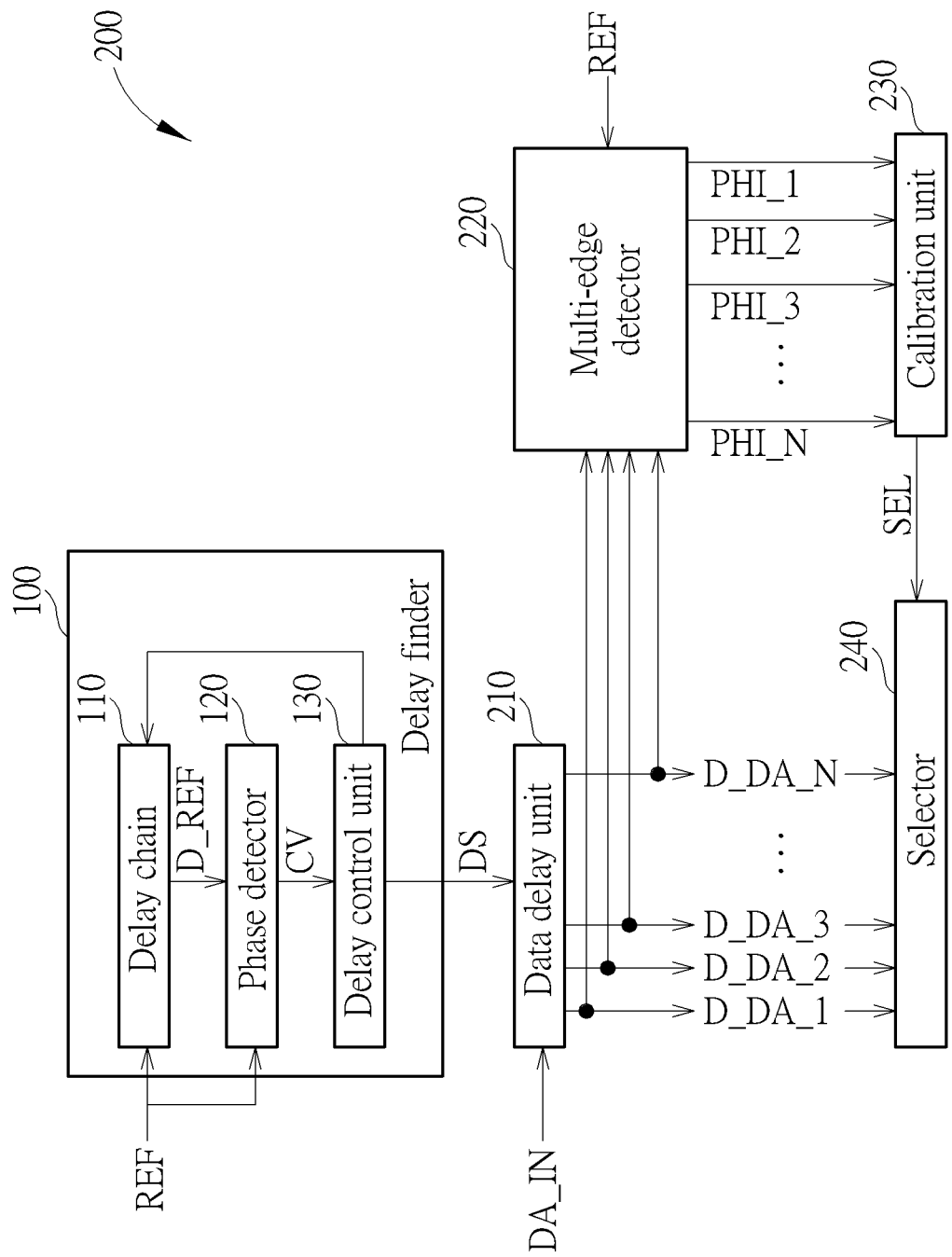
FIG. 4 illustrates a schematic diagram of an all-digital skew canceller 200 according to one embodiment of the present invention.

Such delay control setting DS can be used in a skew canceller as shown in FIG. 4 for controlling a data delayed chain (which will be further explained later). However, the delay control setting DS may also cause the phase shift between the delayed reference clock signal D_REF and the reference clock signal REF to be the undesired value of 1.5T, 2.5T . . . or (N.5)T, instead of the desired value of 0.5 T for some reasons. Under such condition, the delay control unit 130 will also stop adjusting the delay control setting DS. This is called harmonic lock, which will unfavorably ruin operations of the skew canceller shown in FIG. 4.

In order to prevent the harmonic lock condition, the delay cells 110_1-110_N are periodically switched between the first mode of operation and the second mode of operation by the reset control signal RST. Please refer to FIG. 2 again. As illustrated, the reset control signal RST is asserted at the beginning, which causes the delay cells 110_1-110_N to be operated in the second mode of operation and therefore causes the delayed reference clock signal D_REF to be reset. Shortly, the reset control signal RST is de-asserted, which causes the delay cells 110_1-110_N to be operated in the first mode of operation and therefore causes the delay control unit 130 to adjust the delay control setting until the phase shift reaches 0.5T. However, if the delay control unit 130 fails to cause the phase shift between the delayed reference clock signal D_REF and the reference clock signal REF to be 0.5T before one period interval of the reset control signal RST expires, the following rising edge of the reset control signal RST will trigger the delay cells 110_1-110_N to be operated in the second mode of operation again. At this time, the delayed reference clock signal D_REF is reset. From waveform of FIG. 2, it can be understood that there is no chance to let the falling edge of the reference clock signal REF to be aligned with the falling edge of the delayed reference clock signal D_REF after more than one period of the reference clock signal REF. Hence, the harmonic lock condition can be prevented. In other words, the delay control unit 130 stops adjusting the delay control setting only when the phase shift between the delayed reference clock signal D_REF and the reference clock signal REF is 0.5T. In a preferred embodiment, the period of the reset control signal RST should be identical to the period of the reference clock signal REF. However, the period of the reset control signal RST may be slightly shorter or longer than the period of the reference clock signal REF in various embodiments of the present invention.

Once the delay control setting DS provided by the delay control unit 130 is able to cause the phase shift between the delayed reference clock signal D_REF and the reference clock signal REF to be 0.5T, the delay control setting DS can be used in an all-digital skew canceller as illustrated in FIG. 4.

Please refer to FIG. 4, which illustrates an all-digital skew canceller 200 according to one embodiment of the present invention. The all-digital skew canceller 200 comprises (but not limited to) the enhanced DLL 100, a data delay chain 210, a multi-edge detector 220, a calibration unit 230 and a selector 240. The data delay chain 210 is coupled to the enhanced DLL 100 and is arranged to delay a data signal DA_IN according to the delay control setting DS, thereby to generate a plurality of delayed data signals D_DA_1-D_DA_N having different phase shifts. The multi-edge detector 220 is coupled to the data delay chain 210 and is arranged to respectively detect the phase shifts of the plurality of delayed data signals D_DA_1-D_DA_N in relation to an edge of the reference clock signal REF thereby to generate a plurality of phase information PHI_1-PHI_N. The calibration unit 230 is coupled to the multi-edge detector 220 and is arranged to generate a selection signal SEL according to the plurality of phase information PHI_1-PHI_N. The selector 240 is coupled to the data delay chain 210 and is arranged to select one from the delayed data signals D_DA_1-D_DA_N as a skew-cancelled data signal DA OUT according to the selection signal SEL.

Figure 5A:
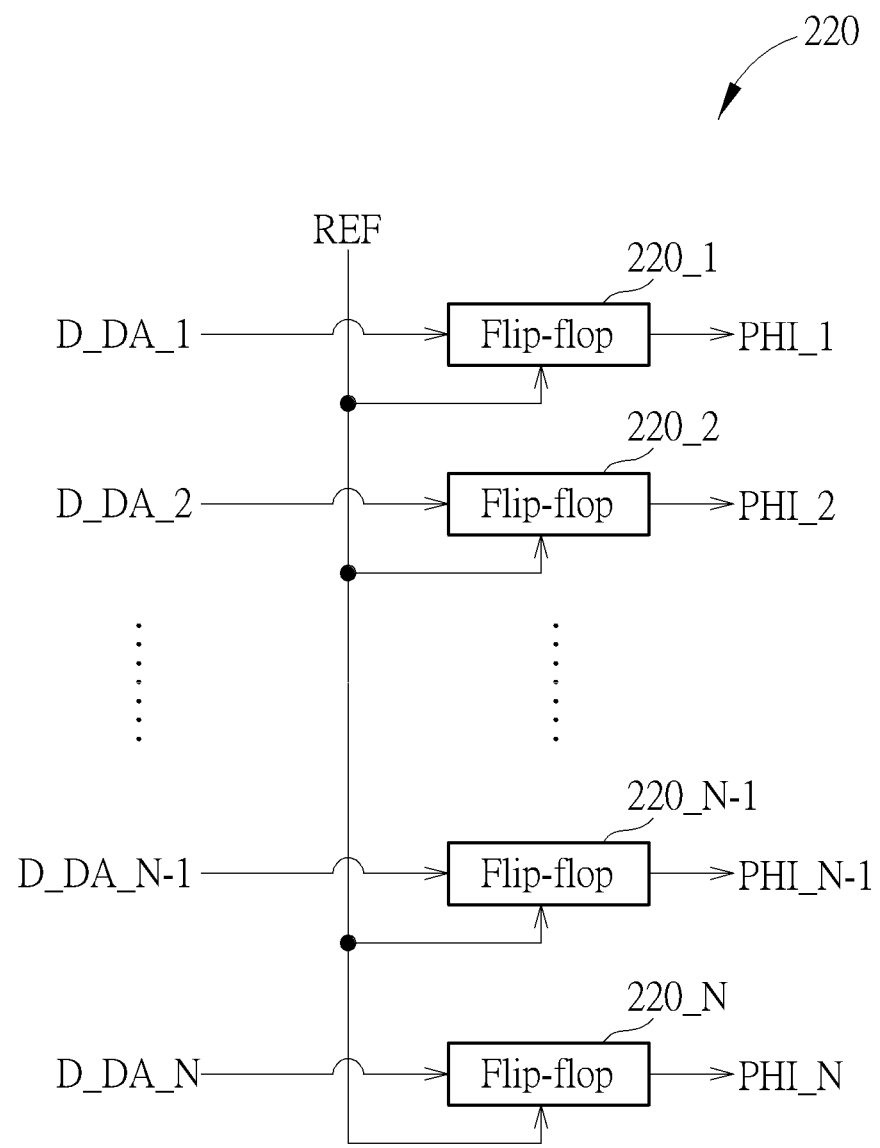
FIG. 5A illustrates a detailed schematic diagram of the multi-edge detector in the all-digital skew according to one embodiment of the present invention.
Figure 5B:
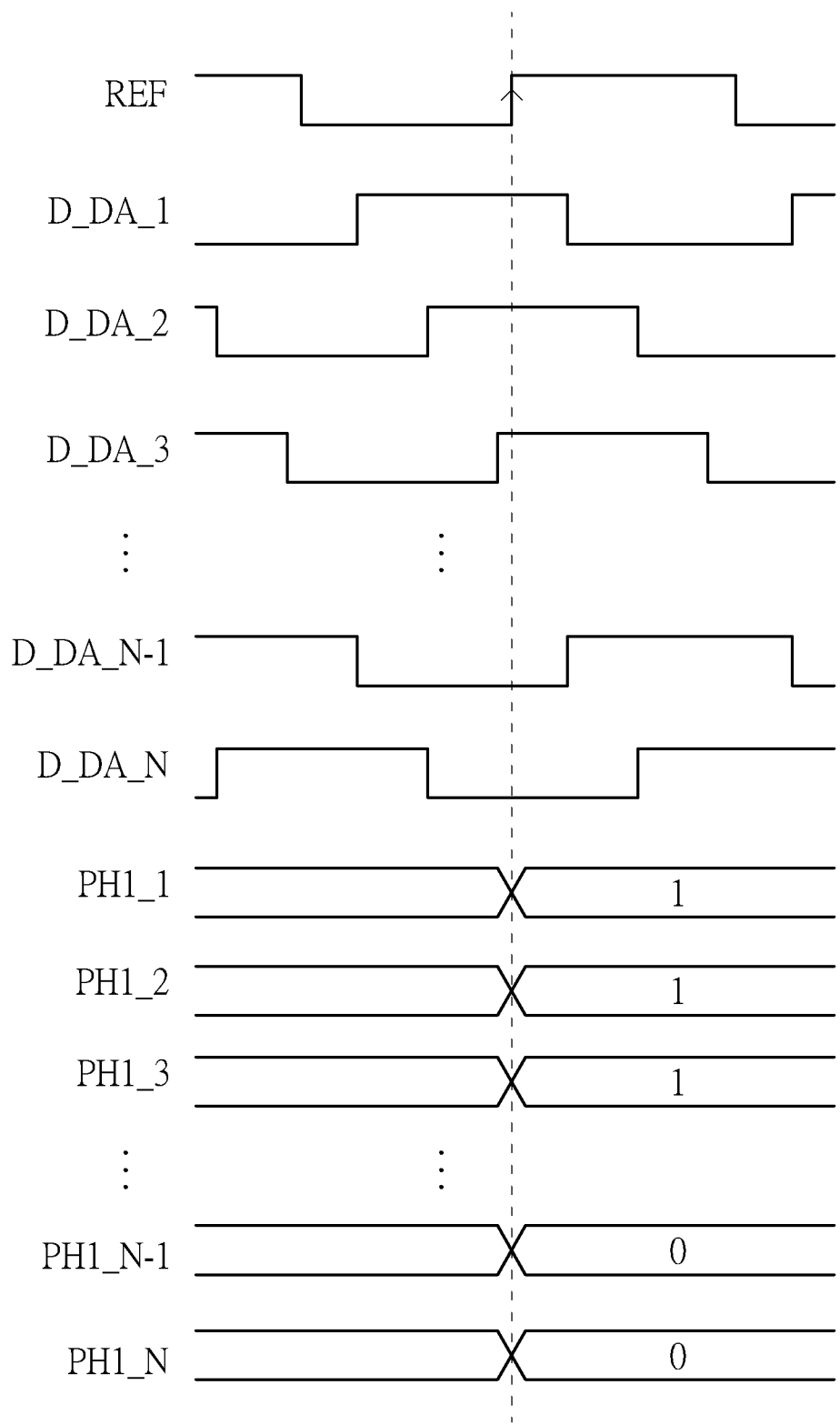
FIG. 5B illustrates a timing chart regarding signals in the multi-edge detector according to one embodiment of the present invention.

Please refer to FIG. 5A, which illustrates a detailed circuit diagram of the multi-edge detector 220 according to one embodiment of the present invention. As illustrated, the multi-edge detector 220 comprises a plurality of flip-flops 220_1-220_N. Each of the flip-flops 220_1-220_N samples one of the delayed data signals D_DA_1-D_DA_N according to an edge of the reference clock signal REF, thereby to generate the phase information PHI_1-PHI_N. A timing chart of related signals is illustrated in FIG. 5B.

Figure 5C:
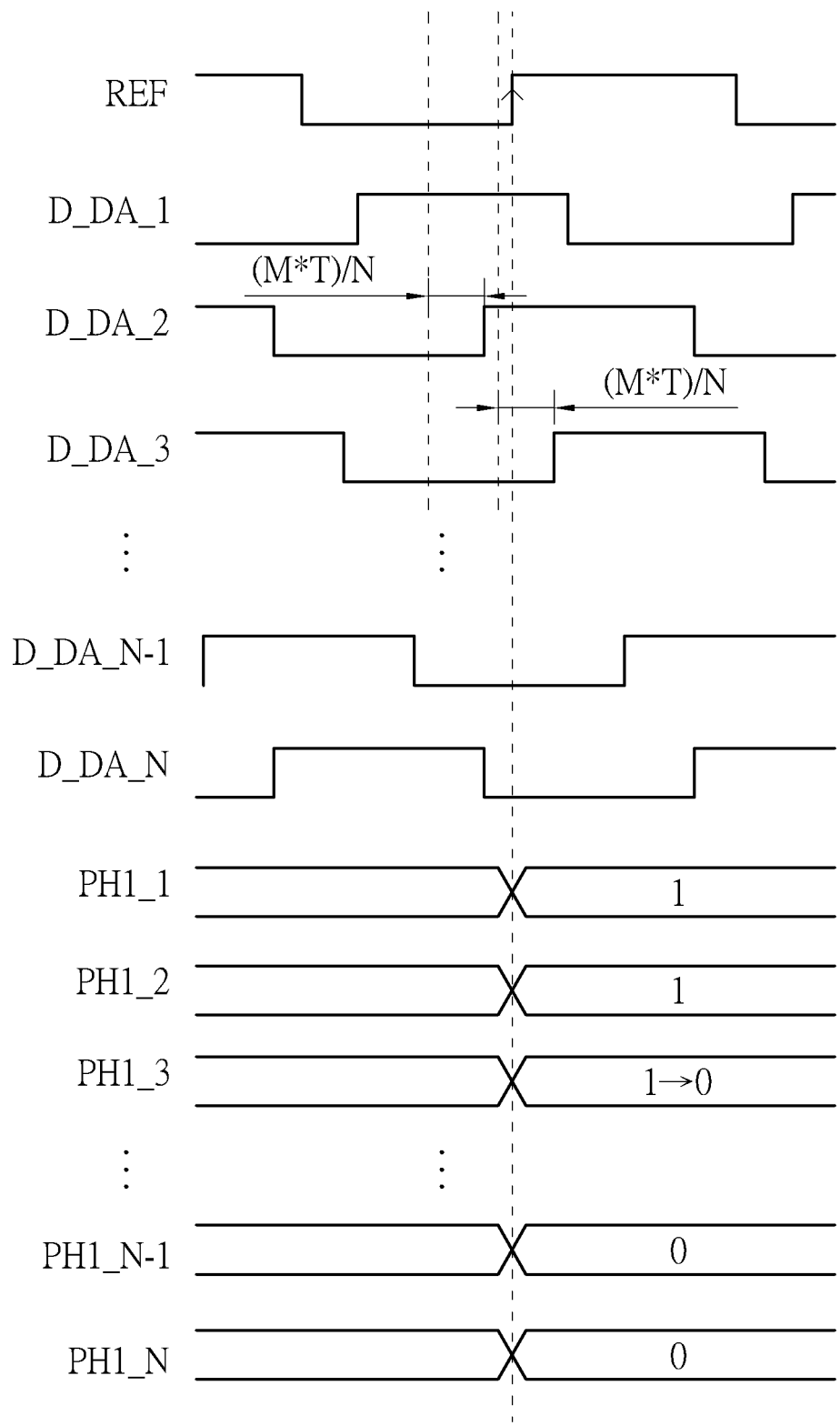
FIG. 5C illustrates a timing chart regarding signals in the multi-edge detector in a case where an enhanced DLL of the present invention is not used.

FIG. 5C further illustrates how the harmonic lock ruins operations of the skew canceller 200 if the enhanced DLL 100 that is operable to prevent the harmonic lock is not used. As illustrated, if the harmonic lock happens at M*T (where "T" is the period of reference clock signal REF and "M" is any positive number except "0.5"), this will further cause an extra delay/phase shift of (M*T)/N on the delayed data signals D_DA_2-D_DA_N, compared to the case where the enhanced DLL 100 is used to guarantee the phase shift of 0.5T. Subsequently, there will be errors in the phase information PHI_1-PHI_N generated by the multi-edge detector 220. This is because the extra delay/phase shift (M*T)/N makes the multi-edge detector 220 fail to sample the D_DA_2-D_D at correct timings. As a result, the skew canceller 200 will fail to cancel skew in data signal DA_IN due to the extra delay/phase shift of (M*T)/N caused by harmonic lock.

Figure 6:
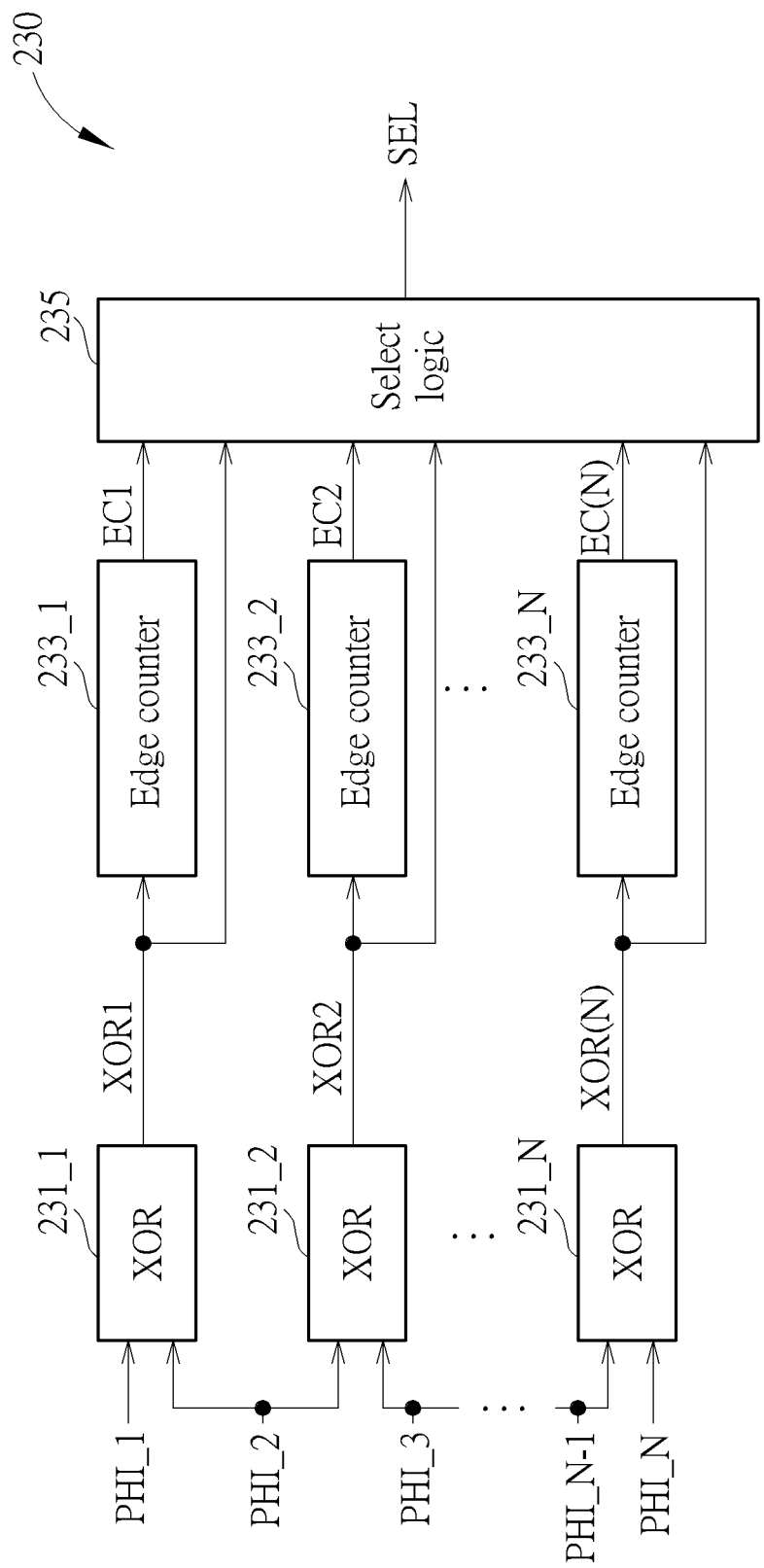
FIG. 6 illustrates a detailed schematic diagram of the calibration unit in the all-digital skew according to one embodiment of the present invention.

Please refer to FIG. 6, which illustrates a detailed circuit diagram of the calibration unit 230 according to one embodiment of the present invention. As illustrated, the calibration unit 230 comprises a plurality of XOR gates 231_1-231_N. Each of the XOR gates 231_1-231_N performs an XOR operation upon two of the phase information PHI_1-PHI_N that are adjacent in phase shift. Hence, XOR outputs XOR1-XOR(N) of the XOR gates 231_1-231_N are able to reflect the phase shifts of delayed data signals D_DA_1-D_DA_N in relation to the reference clock signal REF. According to the phase shifts reflected by the XOR outputs XOR1-XOR(N), edge counters 233_1-233_N generates counter values EC1-EC(N). Then, a select logic 235 generates the selection signal SEL according to the XOR outputs XOR1-XOR(N) and the counter values EC1-EC(N).

In summary, the enhanced DLL of the present invention can avoid the harmonic lock condition during a skew cancelling application, which is achieved by periodically reset the enhanced DLL, thereby to avoid error delay time (e.g. any delay time larger than 1T) being introduced to the delay chain. As such, the enhanced DLL would be favorable in a wide operating range application. Furthermore, the all-digital skew canceller of the present invention is more circuit area efficiency than conventional PLL-based designs because the loop filter is not necessary in the design of the present invention. As such, the all-digital skew canceller of the present invention is more advantageous in a SOC system or other compact designs.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A enhanced DLL for finding a delay control setting, comprising:
    a delay chain, arranged to delay a reference clock signal to generate a delayed reference clock signal and reflect the delay control setting on the delayed reference clock signal, comprising:
        a plurality of delay cells, coupled in series, at least one of which receives a delayed signal outputted from a previous one of the delay cells in series and a predetermined signal, operable in two modes of operation, wherein in a first mode of operation at least one of the delay cells causes a phase shift on the delayed signal thereby to reflect the delay control setting on the delayed reference clock signal, and in a second mode of operation at least one of the delay cells causes the phase shift on the predetermined signal to reset the delayed reference clock signal; and the modes of the operation are periodically switched according to a period of the reference clock signal; and
    a phase detector, coupled to the delay chain, arranged to detect a phase shift between the delayed reference clock signal and the reference clock signal, thereby to generate a control value; and
    a delay control unit, coupled to the delay chain and the phase detector, arranged to adjust the delay control setting based on the control value.

2. The enhanced DLL of claim 1, wherein the at least one of the delay cells comprises:
    a selector, controlled by a periodic signal, having a first input for receiving the delayed signal from the previous one of the delay cells in series and a second input for receiving the predetermined signal, arranged to select one of the delayed signal and the predetermined signal as a selected signal according to the periodic signal; and
    a delay gate, controlled by the delay control setting to exhibit the phase shift, arranged to apply the phase shift on the signal selected by the selector.

3. The enhanced DLL of claim 2, wherein a period of the periodic signal is substantially not longer than a period of the reference clock signal.

4. The enhanced DLL of claim 2, wherein the predetermined signal has a constant logic value.

5. The enhanced DLL of claim 1, wherein the delay control unit comprises:
    an accumulator, coupled to the phase detector, arranged to accumulate the control values that are generated over a period of time to generate an accumulated value;
    wherein the control value causes an increase in the accumulated value when the phase detector detects the delayed reference clock signal has a phase lag to the reference clock signal; and the control value causes a decrease in the accumulated value when the phase detector detects the delayed reference clock signal has a phase lead to the reference clock signal.

6. The enhanced DLL of claim 5, wherein the delay control unit is arranged to generate the delay control signal according to an initial value and the accumulated value.

7. The enhanced DLL of claim 5, wherein the delay control unit stops adjusting the delay control setting once the phase shift between the delayed reference clock signal and the reference clock signal is half a period of the reference clock signal.

* * * * *